United States Patent
Gates et al.

(10) Patent No.: US 7,915,180 B2
(45) Date of Patent: *Mar. 29, 2011

(54) SICOH FILM PREPARATION USING PRECURSORS WITH BUILT-IN POROGEN FUNCTIONALITY

(75) Inventors: Stephen M. Gates, Ossining, NY (US); Alfred Grill, White Plains, NY (US); Robert D. Miller, San Jose, CA (US); Deborah A. Neumayer, Danbury, CT (US); Son Nguyen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

This patent is subject to a terminal disclaimer.

(21) Appl. No.: 12/425,843

(22) Filed: Apr. 17, 2009

(65) Prior Publication Data
US 2009/0203225 A1    Aug. 13, 2009

Related U.S. Application Data

(63) Continuation of application No. 11/329,560, filed on Jan. 11, 2006, now Pat. No. 7,521,377.

(51) Int. Cl.
*H01L 21/31* (2006.01)
*H01L 21/469* (2006.01)

(52) U.S. Cl. ......... 438/780; 438/789; 438/790; 438/781

(58) Field of Classification Search .................. 438/780, 438/789, 773, 792, 790, 623, 781, 788, 793
See application file for complete search history.

(56) References Cited

U.S. PATENT DOCUMENTS

7,521,377 B2 *  4/2009  Gates et al. .................. 438/780
2005/0230834 A1 * 10/2005 Schmitt et al. ............... 257/758

OTHER PUBLICATIONS

Hacker, N. et al. "Properties of New Low Dielectric Constant Spin-on Silicon Oxide Based Polymers." *Mat. Res. Soc. Symp. Proc.* vol. 476 (1997).
Teruyuki, H. et al. "Platinum-Complex-Catalyzed Double Silylation of Ethylene and Norbornene with Disilanes." *Organomet.* vol. 9 (1990).
Piccoli, W. et al. "Highly Strained Cyclic Paraffin-Siloxanes." *J. Am. Chem. Soc.* vol. 82 (1960).

(Continued)

*Primary Examiner* — Chuong A. Luu
(74) *Attorney, Agent, or Firm* — Scully, Scott, Murphy & Presser, P.C.; Louis J. Percello, Esq.

(57) ABSTRACT

A method of fabricating a dielectric material that has an ultra low dielectric constant (or ultra low k) using at least one organosilicon precursor is described. The organosilicon precursor employed in the present invention includes a molecule containing both an Si—O structure and a sacrificial organic group, as a leaving group. The use of an organosilicon precursor containing a molecular scale sacrificial leaving group enables control of the pore size at the nanometer scale, control of the compositional and structural uniformity and simplifies the manufacturing process. Moreover, fabrication of a dielectric film from a single precursor enables better control of the final porosity in the film and a narrower pore size distribution resulting in better mechanical properties at the same value of dielectric constant.

20 Claims, 2 Drawing Sheets

OTHER PUBLICATIONS

Watanabe H. et al. "Reaction of Disilanes With Acetylenes—Double Silylation of 1-Hexyne, Trimethylsilylacetylene and Acetylene With Methoxymethyldisilanes Catalyzed by Tetrakis (Triphenylphosphine) Palladium." *J. Organmet. Chem.* vol. 216 (1981).

Rahimian, K. et al. "Nonshrinking, Photopolymerizable Polycarbosiloxanes Through Ring-Opening Polymerization of Disilaoxacyclopentane Monomers." *Chem. Mater.* vol. 17 (2005).

* cited by examiner

SICOH FILM PREPARATION USING PRECURSORS WITH BUILT-IN POROGEN FUNCTIONALITY

RELATED APPLICATIONS

This application is a continuation of U.S. patent application Ser. No. 11/329,560, filed Jan. 11, 2006 now U.S. Pat. No. 7,521,377. The present application is related to co-assigned U.S. application Ser. No. 10/964,254, filed Oct. 13, 2004, entitled "ULTRA LOW k PLASMA ENHANCED CHEMICAL VAPOR DEPOSITION PROCESSES USING A SINGLE BIFUNCTIONAL PRECURSOR CONTAINING BOTH A SiCOH MATRIX FUNCTIONALITY AND ORGANIC POROGEN FUNCTIONALITY", now U.S. Pat. No. 7,491,658 the entire contents of which is incorporated herein by reference.

FIELD OF THE INVENTION

The present invention generally relates to a method of fabricating a dielectric material that has an ultra low dielectric constant (or ultra low k) using at least one organosilicon precursor. The organosilicon precursor employed in the present invention includes a molecule containing both an Si—O structure and a sacrificial organic group, as a leaving group. The use of an organosilicon precursor containing a molecular scale sacrificial leaving group enables control of the pore size at the nanometer scale, control of the compositional and structural uniformity and simplifies the manufacturing process. Moreover, fabrication of a dielectric film from a single precursor enables better control of the final porosity in the film and a narrower pore size distribution resulting in better mechanical properties at the same value of dielectric constant.

BACKGROUND OF THE INVENTION

The continuous shrinking in dimensions of electronic devices utilized in ultra large scale integrated (ULSI) circuits in recent years has resulted in increasing the resistance of the back-end-of-the-line (BEOL) metallization as well as increasing the capacitance of the intralayer and interlayer dielectric. This combined effect increases signal delays in ULSI electronic devices. In order to improve the switching performance of future ULSI circuits, low dielectric constant (k) insulators, particularly those with a dielectric constant significantly lower than silicon oxide, are needed to reduce the capacitances. Dielectric materials (i.e., dielectrics) that have low k values are commercially available. Most commercially available dielectric materials, however, are not thermally stable when exposed to temperatures above 300° C. Integration of low k dielectrics in present ULSI chips requires a thermal stability of at least 400° C.

The low k materials that have been considered for applications in ULSI devices include polymers containing atoms of Si, C, O and H, such as methylsiloxane, methylsilsesquioxanes, and other organic and inorganic polymers. For instance, an article by N. Hacker et al. "Properties of new low dielectric constant spin-on silicon oxide based dielectrics" *Mat. Res. Soc. Symp. Proc.* 476 (1997): 25 describes materials that appear to satisfy the thermal stability requirement, even though some of these materials propagate cracks easily when reaching thicknesses needed for integration in an interconnect structure when films are prepared by a spin-on technique.

The ability to fabricate a low k material by either a spin-on or a plasma enhanced chemical vapor deposition (PECVD) technique is an advantage. Despite the numerous disclosures of low k dielectric materials, there is a continued need to improve the properties of these materials. For example, a SiCOH dielectric material having a lower internal stress, improved thermal stability, lower cost, nanometer scale pore size, narrow distribution of pore size, homogeneous pore distributions throughout the film thickness, and better process control within processing temperatures used in current ULSI technologies are all needed.

It is commonly found when making SiCOH dielectrics by conventional spin-on techniques using various chemistries that the final film has a pore size distribution that is broader than desired, and often includes pores larger than 2 nm diameter.

It is also commonly found that SiCOH dielectrics made in the prior art from two or more separate organosilicon and/or porogen molecules are not uniform in atomic and structural composition, both when measured across the substrate diameter, and through the depth of the dielectric layer. The use of 300 mm Si wafers has made this problem of chemical uniformity across the wafer more pronounced.

Additionally, prior art CVD SiCOH dielectrics made from two or more separate organosilicon and/or porogen molecules were found to exhibit process variation or process instability due to small changes in the flow rate of one of the two precursors, known to those skilled in the art as drift in the flow rate. Moreover, prior art SiCOH dielectrics made from two or more separate organosilicon and/or porogen molecules in a PECVD process have been found to have a small component of larger pores due to the formation of dimers or trimers of the porogen in the PECVD reactor.

In view of the above, there is a need to provide a process to fabricate a layer of a SiCOH dielectric having improved film properties, that has an easily controlled, narrow, pore size distribution, and is uniform in atomic and structural composition, both when measured across the substrate diameter, and through the depth of the layer, which does not exhibit any variation in the process or process instability.

SUMMARY OF THE INVENTION

The present invention provides a method for fabricating a porous dielectric material of the general composition SiCOH having a dielectric constant of not more than about 2.7 from at least one organosilicon precursor containing a built-in sacrificial organic porogen. In a preferred embodiment of the present invention, a single organosilicon precursor containing a built-in sacrificial organic porogen is employed. Both a spin-on embodiment and a PECVD embodiment are described in the present application.

As to be described in greater detail herein below, the built-in sacrificial organic porogen is a functional group that is present and covalently bound to the preliminary film skeleton, which is subsequently removed by an energetic treatment step. As such, the porogen employed in the present invention is not present in the dielectric film. Instead, pores (e.g., voids) are present in the dielectric film after the energetic treatment step, which renders the dielectric film porous. Preferably, the dielectric constant of the dielectric material of the present invention is from about 1.5 to about 2.6, and most preferably, the dielectric constant is from about 1.8 to 2.5. All dielectric constants mentioned in the present application are relative to a vacuum, unless otherwise specified. Because the inventive dielectric film has a k that is not more than 2.7, it can be referred to as an ultra low k (ULK) dielectric.

Specifically, the present invention provides methods for fabricating a porous SiCOH dielectric comprising Si, C, O and H atoms using deposition of a preliminary film and an energetic treatment to transform the preliminary film into a porous ULK dielectric film.

More specifically, the present invention describes methods for fabricating a layer of a SiCOH dielectric material having improved film properties, which is uniform in atomic and structural composition, both when measured across the substrate diameter, and through the depth of the layer, that does not exhibit variation in the process or process instability. Further, the dielectric films of the present invention have a pore size on the nanometer scale without the presence of larger pores, and hence the distribution of pores sizes is uniform and narrow.

The use of the inventive methods with deposition of a preliminary film from one or more, preferably a single, organosilicon precursors containing a built-in sacrificial organic porogen enables better control of the porosity in the final film and a narrower pore size distribution, resulting in better mechanical properties at the same values of dielectric constant. Furthermore, the deposition of a preliminary film from the organosilicon precursors described herein enables improved mechanical properties of the final SiCOH dielectric film.

By "improved mechanical properties" it is meant that the final porous dielectric film formed from the method of the present invention has a tensile stress of less than 60 MPa, an elastic modulus from about 2 to about 15 GPa, and a hardness from about 0.2 to about 2 GPa as determined by nanoindentation techniques. The stress value is measured by measuring the curvature of a substrate both with, and without, the film deposited on said substrate, and using the change in curvature to calculate the stress. Tools operating on this principle are well known in the art. The modulus is commonly measured by nanoindentation on a film of 1 micron thickness, or greater. Other methods to measure the modulus are less common, for example surface acoustic wave spectroscopy (SAWS).

In broad terms, the method of the present invention comprises:

providing at least one organosilicon precursor containing a built-in sacrificial organic porogen, where said at least one organosilicon precursor with the built-in sacrificial organic porogen is selected from silane (SiH$_4$) derivatives having the molecular formula SiR*R$^1$R$^2$R$^3$, disiloxane derivatives having the molecular formula R*R$^5$R$^6$Si—O—Si—R$^7$R$^8$R$^9$, trisiloxane derivatives having the molecular formula R*R$^{11}$R$^{12}$—Si—O—Si—R$^{13}$R$^{14}$—O—Si—R$^{15}$R$^{16}$R$^{17}$ and disilaalkane derivatives having the molecular formula R*R$^5$R$^6$Si—(CH$_2$)$_n$—Si—R$^7$R$^8$R$^9$, where n equals 1-2, R* is a sacrificial organic porogen group, and R$^{1-17}$, which may or may not be identical, are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents;

forming a preliminary dielectric film containing said at least one organosilicon precursor with the built-in sacrificial organic porogen on a surface of a substrate from the vapor or liquid phase; and performing an energetic treatment step on said preliminary dielectric film to substantially remove said built-in sacrificial organic porogen from said preliminary dielectric film providing a porous dielectric film comprising atoms of Si, C, H and O that has a dielectric constant of about 2.7 or less and a uniform and narrow and uniform pore size distribution.

According to the present invention, the sacrificial organic porogen group R* is selected from a branched alkyl including, for example, tertiary-butyl, branched alkoxy including, for example, tertiary butoxy, cyclic alkyl, cyclic alkoxy, aldehydes, ketones, esters, thioesters, amines, urethanes, triphenyl, alkyl phenyl carbinyl, substituted allyl, cyclohepatrienyl, cyclopropyl carbinyl, nitrites, azo derivatives, and alkyl groups which are connected to Si by a linker group. The linker group, which is connected to silicon, may itself be thermally/photochemically labile or provide a platform to which labile substituents can be attached (e.g., hydroxyethyl, hydroxypropyl, aminoethyl, aminopropyl, carboxyethyl, carboxypropyl, branched functional tethers, etc). Typically, the linker functionality will be sensitive to heat, light, ionizing radiation, or catalytic reagents generated as above. Preferably, the sacrificial porogen group R* is selected from a branched alkyl, cyclic alkyl, branched alkoxy, cyclic alkoxy, aldehydes, ketones, esters, thioesters, amines, urethanes, nitrites, azo derivatives, triphenyl, cycloheptatrienyl and alkyl groups which are connected to Si by the linker group. Alternatively, the labile group may be directly bonded to silicon without a linker group (e.g., branched alkoxy, etc.) such that the alkyl substituent is removed upon treatment leading to a silanol, which undergoes subsequent condensation into the final film.

In accordance with the present invention, the preliminary film contains a functional group selected from the group consisting of branched or cyclic hydrocarbon groups, polycyclic hydrocarbon groups, branched or cyclic hydrocarbon groups bonded between two or more Si atoms, polycyclic hydrocarbon groups bonded between two or more Si atoms, acyl groups, ester groups, xanthate groups, amines, amine oxides, ethers, sulfonyl, sulfinyl, phosphate, phosphonyl, phosphinyl, organometallic and borate groups.

In accordance with the present invention, the energetic treatment step releases molecules from the preliminary film that are selected from the group consisting of linear or cyclic hydrocarbon fragments, olefins, acetylenes, alcohols, organic acids, amides, vinyl esters, xanthates, thioacids, amines, hydroxylamines, phosphines, phosphoric acids, phosphoric esters, substituted phosphonic, phosphinic esters, sulfonic acids, sulfinic acids, sulfides, mercaptans, nitrites and borates, and smaller fragments of these functional groups.

In a preferred embodiment of the present invention, the at least one organosilicon precursor containing a built-in sacrificial organic porogen has molecules of the following basic formulas;

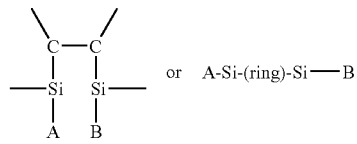

wherein at least one of A, B or ring is R* as described above, and wherein ring further is either one hydrocarbon ring containing a C—C unit bonded between two Si atoms or a polycyclic structure containing a C—C unit between two Si atoms. It is noted that these formulas are generic to those shown in Schemes 1-5 below. Within the invention, one R* group may be present on one Si atom, or there may be two R* groups on two Si atoms.

According to this invention, the energetic treatment step may use one or more of light, ionizing radiation, thermal energy or the generation of a catalytic species, and the R* substituents are essentially removed in this step to produce nanometer scale porosity in the final film.

In addition to the method described above, the present invention also provides a SiCOH dielectric film which is prepared using the method described above. Specifically, the dielectric film of the present invention comprises a dielectric material comprising atoms of Si, C, O and H, said dielectric material having a covalently bonded tri-dimensional network structure, a dielectric constant of not more than 2.7, a controlled porosity having molecular scale voids from about 0.3 to about 20 nanometers in diameter, and preferably from about 0.3 to about 5 nm in diameter. According to the invention, the molecular scale voids occupy a volume of between about 5% and about 60%.

Also according to the invention, the dielectric material contains nanometer or molecular scale pores (voids) that are characterized by a pore size distribution (PSD), which has a maximum. The maximum size distribution is the most common pore size, and it is typically about 1-2 nanometers. More generally, the maximum size of the pores is from about 0.1 to 10 nanometers, with 0.3 to 3 nanometers being preferred. The removal of the R* group produces this porosity called here "nanometer scale porosity". The PSD is measured with characteristic dimensions in nanometers.

The at least one dielectric film comprising the inventive SiCOH dielectric may comprise an interlevel and/or intralevel dielectric layer, a capping layer, and/or a hard mask/polish-stop layer in an electronic structure.

DETAILED DESCRIPTION OF THE INVENTION

Figure 1:
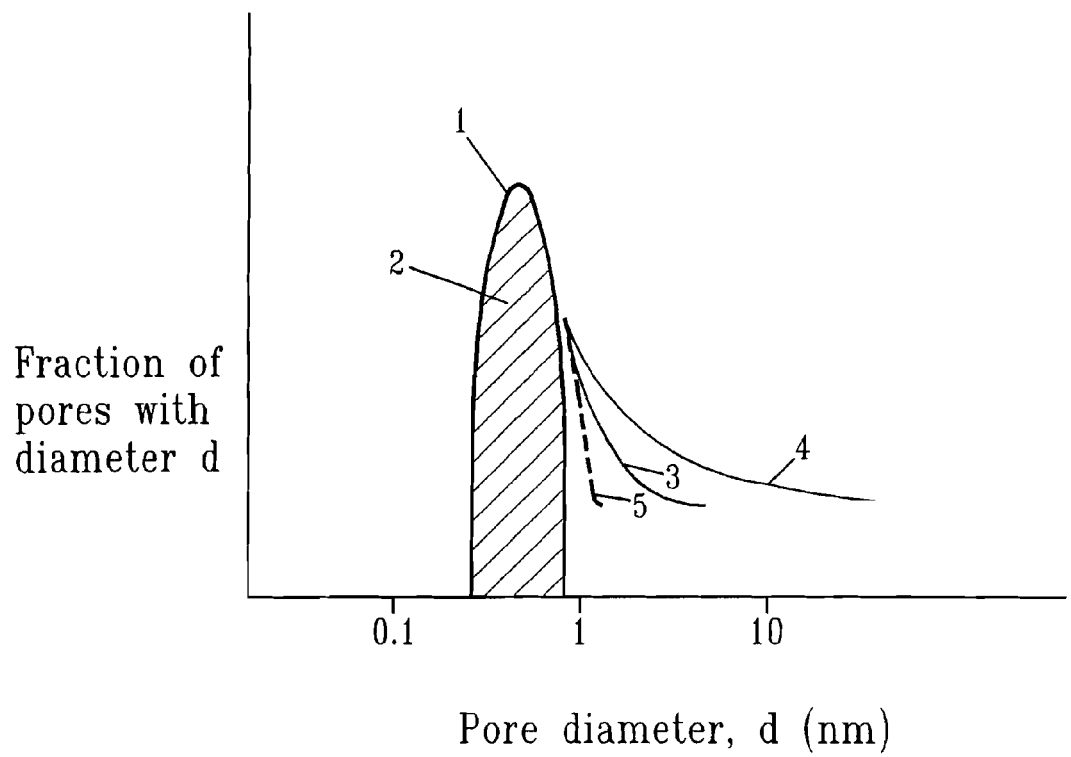
FIG. 1 is a schematic representation of the measured pore size distribution of the films of the present invention.

The present invention, which provides a method of fabricating a porous ULK dielectric film having a uniform and narrow pore size distribution utilizing at least one organosilicon having a built-in sacrificial organic porogen, will now be described in greater detail by referring to the following discussion as well as the drawings that accompany the present application.

As stated above, the present invention provides a method of fabricating a porous ULK dielectric film which includes first providing at least one, preferably a single, organosilicon precursor containing a built-in sacrificial porogen, where said at least one organosilicon precursor with the built-in sacrificial organic porogen is selected from silane ($SiH_4$) derivatives having the molecular formula $SiR*R^1R^2R^3$, disiloxane derivatives having the molecular formula $R*R^5R^6Si$—O—$Si$—$R^7R^8R^9$, trisiloxane derivatives having the molecular formula $R*R^{11}R^{12}$—$Si$—O—$Si$—$R^{13}R^{14}$—O—$Si$—$R^{15}R^{16}R^{17}$ and disilaalkane derivatives having the molecular formula $R*R^5R^6Si$—$(CH_2)_n$—$Si$—$R^7R^8R^9$, where n is 1-2, R* is a sacrificial porogen group and $R^{1-17}$, which may or may not be identical, are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents. In one highly preferred embodiment, the organosilicon precursor includes a 1,3-disilapropane derivative such that the resultant film formed after energetic treatment includes $Si$—$CH_2$—$Si$ bonding units.

The term "alkyl" is used herein to denote a paraffinic hydrocarbon group having the formula —$C_nH_{2n+1}$ where n is an integer of 1 or greater, preferably n is from 1 to 16. Examples of such alkyls include, but are not limited to: methyl, ethyl, butyl, propyl, and the like including branched and cyclic systems.

The term "alkoxy" is used herein to denote a compound having the formula —OR, wherein R is an alkyl group as defined above. Examples of such alkoxys include, but are not limited to: methoxy, ethoxy, butoxy, propoxy and the other like compounds including carbon-branched and cyclic.

The term "epoxy" is used herein to denote an organic compound containing a reactive group resulting from the union of an oxygen atom with two carbon atoms. Examples of such epoxies include, but are not limited to: ethylene oxide.

The term "phenyl" group is used herein to denote a —$C_6H_5$ group that is derived from benzene. Also included would be alkyl or alkoxy substituted benzene derivatives including those with multiple substitution.

The term "vinyl" is used herein to denote a compound having a $CH_2$—CH— group. Examples include vinyl chloride, vinyl acetate, styrene, methyl methacrylate and acrylonitrile.

The term "allyl" is used in the present application to denotes a compound having a $CH_2$=$CHCH_2$— group. Examples include allyl chloride, allyl bromide, allyl amine, allyl alcohol, allyl acrylate, allyl acetone and the like.

The term "alkenyl" denotes a compound including a saturated group having the formula —$C_mH_{2m}$ wherein m is an integer of 2 or greater, preferably m is from 2 to 20. Examples, include, but are not limited to: ethylene, propylene, butylene and the like.

The term "alkynyl" denotes a compound a paraffinic compound that includes at least one —C≡C— bond. Examples include, but are not limited to: ethynyl, propynyl, 1-butynyl, 1hexyne, 3-hexyne, and the like. Diynes and triynes are included within the definition of an alkynyl.

According to the present invention, the sacrificial organic porogen group R* is selected from a branched alkyl including, for example, tertiary-butyl, branched alkoxy including, for example, tertiary butoxy, cyclic alkyl, cyclic alkoxy, aldehydes, ketones, esters, thioesters, amines, urethanes, triphenyl, alkyl phenyl carbinyl, substituted allyl, cyclohepatrienyl, cyclopropyl carbonyl, nitriles, azo derivatives, and alkyl groups which are connected to Si by a linker group. The linker group, which is connected to silicon, may itself be thermally/photochemically labile or provide a platform to which labile substituents can be attached (e.g., hydroxyethyl, hydroxypropyl, aminoethyl, aminopropyl, carboxyethyl, carboxypropyl, branched functional tethers, etc.). Typically, the functionality bound by the linker group will be sensitive to heat, light, ionizing radiation, or catalytic reagents generated as above. Preferably, the sacrificial porogen group R* is selected from branched alkyl, cyclic alkyl, branched alkoxy, cyclic alkoxy, aldehydes, ketones, esters, thioesters, amines, urethanes, nitrites, azo derivatives, triphenyl, cycloheptatrienyl and alkyl groups which are connected to Si by the linker group. The labile group may be directly bonded to silicon without a linker (e.g., branched alkoxy, etc.) such that the alkyl substituent is removed upon thermal/photochemical treatment leading to a silanol that undergoes subsequent condensation into the matrix. In this regard, it may be advantageous to exchange some of the methoxy/ethoxy substituents in the sol-gel precursor with bulky alkoxy substituents which are not easily hydrolyzed (tertiary alkoxy, isopropoxy, neopentoxy, fenchyloxy, 5-norbornenyloxy, etc.) but are thermally labile or are labile to light or ionizing radiation or catalytic species generated therein (e.g. acid or base).

A preliminary dielectric film is then formed on a surface of a substrate by introducing the at least one organosilicon precursor with the built-in sacrificial organic porogen into a reactor including the substrate. After the preliminary dielectric film is formed, an energetic treatment step is performed to substantially remove said built-in porogen from the preliminary dielectric film. Thus, a porous dielectric film comprising atoms of Si, C, H and O that has a dielectric constant of about 2.7 or less and a uniform and narrow pore size distribution is formed after the above steps have been performed.

Specifically, a porous SiCOH dielectric material having improved film properties, which is uniform in atomic and structural composition, both when measured across the substrate diameter, and through the depth of the layer, that does not exhibit variation in the process or process instability is provided. Further, the dielectric films of the present invention have a pore size on the nanometer scale without the presence of larger pores, and hence the distribution of pores sizes is uniform and narrow.

By "uniform in atomic composition", it is meant that the dielectric material of the present application has a substantially constant distribution of atoms throughout the film in both the vertical and horizontal direction. By "uniform in structural composition", it is meant a substantially constant arrangement of atoms within the film in both the vertical and horizontal directions. By "uniform and narrow" it is meant that the distribution of pores sizes does not contain a large diameter tail. Referring to FIG. 1, the curve labeled 1 is the PSD of the majority fraction of the pores of the inventive porous dielectric material, and the cross-hatched area under Curve 1 is labeled 2, and is the fraction of the pores having a diameter of less than 1 nm. The component of pores larger than 1 nm is labeled 4 for a typical material of the prior art, and the component of pores larger than 1 nm for the dielectric material in accordance with one of the embodiments is labeled 3. The component of pores larger than 1 nm for a preferred material of the present invention is the dashed line labeled 5.

In a preferred treatment, the substrate containing the film deposited according to the above process is placed in an ultraviolet (UV) treatment tool, with a controlled environment (vacuum or reducing environment containing $H_2$, or an ultra pure inert gas with a low $O_2$ and $H_2O$ concentration). A pulsed or continuous UV source may be used, a substrate temperature of 300°-450° C. may be used, and at least one UV wavelength in the range of 170-400 nm may be used. UV wavelengths in the range of 190-300 nm are preferred within the invention.

Within the invention, the UV treatment tool may be connected to the deposition tool ("clustered"), or may be a separate tool. Thus, as is known in the art, the two process steps will be conducted within the invention in two separate process chambers that may be clustered on a single process tool, or the two chambers may be in separate process tools ("declustered").

The present invention contemplates embodiments where spin-on coating is employed in forming the preliminary dielectric film and embodiments where PECVD is employed in forming the preliminary dielectric film. Details of these various embodiments of the present invention will be described in greater detail herein below.

The term "substrate" as used throughout the present application denotes a semiconductor material, an insulating material and/or a conductive material. The "and/or" designation means that combinations and multilayers of these materials can be present in the substrate. Examples of semiconductor material include Si, SiGe, SiC, SiGeC, InAs, InP, Ge alloys, GaAs, silicon-on-insulators (SOIs), SiGe-on-insulators (SGOIs) and other like materials that exhibit semiconducting properties. Examples of insulating materials include inorganic dielectrics such as, for example, $SiO_2$, $Al_2O_3$, $Ta_2O_5$, $TiO_2$, $LaO_2$ and perovskite-type oxides, as well as organic dielectrics such as, for example, polyimdes, organosilanes, carbon doped oxides, and polyarylenes. Examples of conductive materials include, for example, metals, metal silicides, metal nitrides and alloys thereof.

Figure 2:
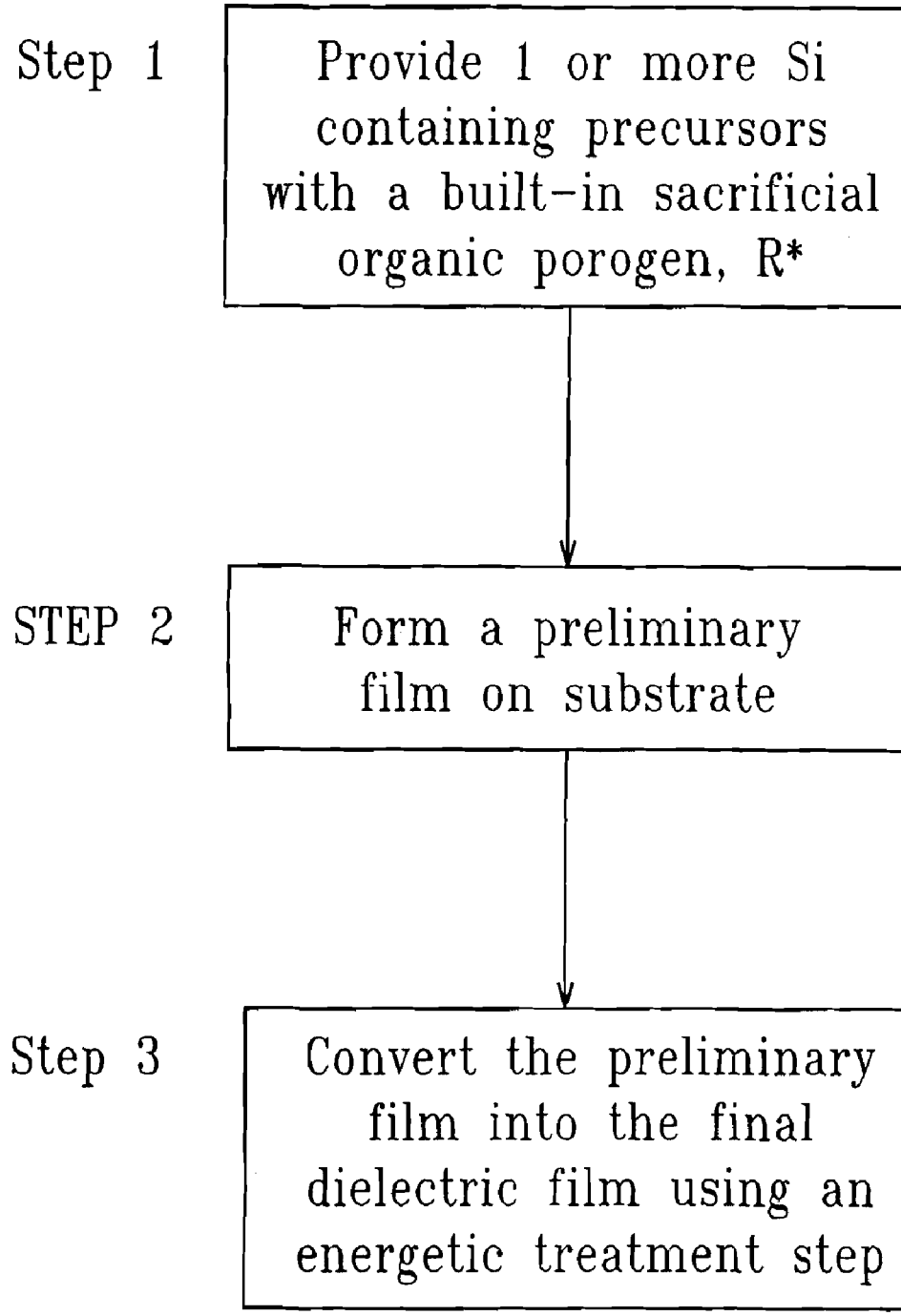
FIG. 2 is a pictorial representation illustrating the basic processing steps of the present invention.

According to the invention, the steps of FIG. 2 are followed. Referring to FIG. 2, in Step 1, the organosilicon precursor molecule contains a substituent R* that is thermally labile, or that may be decomposed by light, ionizing radiation or the generation of catalytic species. In Step 2, a preliminary film is formed containing the R* groups. Formation of the preliminary film may include formation of a prepolymer by solution phase chemistry. The prepolymer is then coated on a substrate and solvent is removed to form the preliminary film. Other methods to form the preliminary film are also described within the invention. In Step 3, the R* substituents are removed in the energetic treatment step.

The final dielectric film contains nanometer scale porosity that is formed by removal of the R* groups. Herein, the labile/decomposable substituents R* are called a "built-in sacrificial organic porogen". In one preferred embodiment, the precursor molecule also contains a combination of Si—$CH_2$—Si and Si—O bonds that will form the skeleton of the final dielectric film. In another preferred embodiment, the dielectric film includes Si—$CH_2$—$CH_2$—Si bonding units.

The preliminary film in Step 2 may be deposited using any deposition method, for example spin-on coating, plasma enhanced chemical vapor deposition (PECVD), thermal chemical vapor deposition, evaporation, or other methods.

In Step 3, energy is applied to the preliminary film in the form of thermal energy, UV light, microwave, electron beam, ion beam or other energy source, such as a catalytic species. In some embodiments, a combination of two or more of these energy sources is employed. The third step described in FIG. 2 transforms the preliminary film into the final porous dielectric film. Specifically, during the third step the removal of the R* group from the previously formed film produces a porosity with a characteristic dimension measured in nanometers, called here "nanometer scale porosity". When the pore size distribution is measured for the final dielectric film, the maximum in the size distribution (most common pore size) is generally about 1 nanometer, and may be from about 0.1 to 10 nanometers, with 0.3 to 3 nanometers being preferred.

The conditions for UV treatment were previously mentioned herein above. The following conditions for the other energetic treatment steps can be employed in the present invention:

Thermal treatment—The thermal treatment may be performed by applying heat to the substrate that includes the preliminary dielectric film. Typically, the temperature of thermal treatment is from about 300° to about 350° C., with a temperature from about 350° to about 450° C. being even more typical. The time of thermal treatment various depending on the type of thermal process used. The thermal process may include a furnace anneal, a rapid thermal anneal, a laser spike anneal, or a laser anneal. The thermal treatment may be performed under vacuum, or in an inert gas atmosphere such as, for example, He, Ar or $N_2$. Under some circumstances the anneal may be performed in an oxidizing (air, CO, $CO_2$, etc.) or reducing ($H_2$, $NH_3$, etc.) atmosphere.

Electron Beam—The electron beam treatment is performed utilizing a tool that is capable of heating the substrate to 300° to 500° C. and generating a uniform electron beam over the entire substrate. This tool operates in vacuum, with electron beam energies in the range of 0.5 to 10 keV (typically 1 to 5 keV) and total beam current in the range of 0.5 to 10 milliAmperes, typically 1-5 milliAmperes. To treat the film, a dose of 50 to 500 microCoulombs/cm² is typically used.

Catalytic Species—A catalytic species such as a supported or unsupported metal catalyst such as, for example, Pt, Pd, Ni, Rh, Cu, Al and the like can be used in removing the sacrificial organic porogen from the preliminary deposited dielectric film. In these cases, the metal is on the substrate perhaps as defined patterns. The film is transformed into a porous material in those regions contacting the metal at temperatures above 300° C. Alternatively a chemical catalyst produced from a thermal or photoacid generator (Bronsted or Lewis) or thermal or photobase generator (Lewis or Bronsted) may be used. The photoacid or photobase generator is incorporated into the dielectric formulation to be liberated after the film has been deposited and partly cured. The catalytic species assists in the removal of the porogen bonded to the silicon-containing species. Similarly the acid or base generators could be sensitive to low valent metal (see above) and be decomposed to produce the catalytic species in those regions where the films come into contact with the metals.

Within all embodiments of the present invention, the chemistry shown is exemplary and related molecules with the same essential features may be used within the invention.

Within some embodiments of the present invention, the prepolymeric solution is processed by sol-gel hydrolysis, coating and thermal curing. This hydrolysis/condensation process may be done using water and acid in the initial stages to form SiOH functionality. Within these embodiments, the presence of catalytic acid assists in the reaction. The presence of acid also facilitates the SiOH condensation to produce siloxane crosslinks. In the examples that use t-butoxy as the R* group, the t-butyl ether serves both as a source of SiOH in a nonaqueous environment and as a source of the pore generator.

The first embodiment of the present application describes the use of a spin-on dielectric film that utilizes an organosilicon precursor with a built-in porogen. Specifically, a multifunctional, polymerizable organosilicon precursor is employed in this embodiment and it is applied to a surface of a substrate. In the first embodiment, referring to Scheme 1 below, sol gel chemistry which is well known in the art is used to generate a prepolymer before coating the prepolymer on the substrate. Within this invention, a key feature is the ability to form prepolymers and condensable oligomers under conditions where thermally labile substituents and photoactive groups, which make up the group R*, are retained in the film. The sacrificial organic porogen substituents R* are then removed in the later energetic treatment step to produce porosity controlled on the nanometer scale under conditions where the carbon linkages bridging silicon are retained. The sacrificial groups may be contained within the condensing alkoxy substituents or on other substituents bound to silicon.

Scheme 1:

Starting materials are disilane derivatives

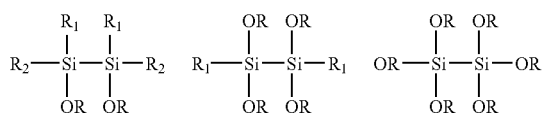

Scheme 1A

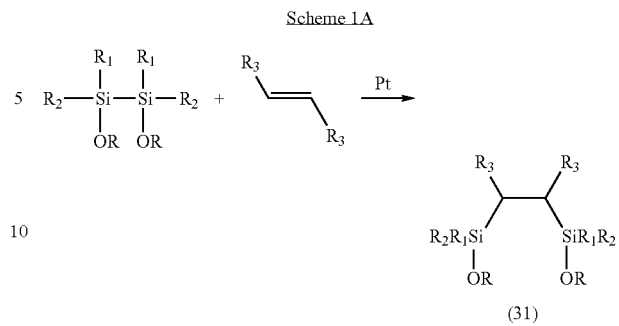

Scheme 1B

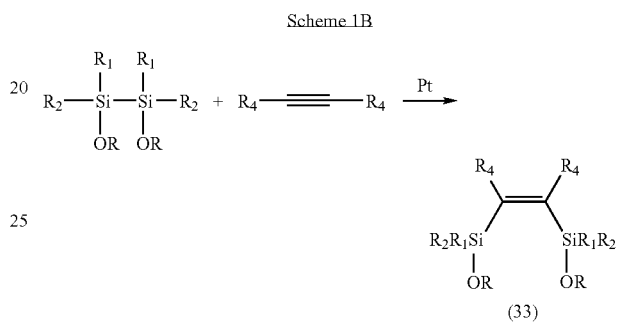

Referring to Scheme 1, R=alkyl $R_1$ and $R_2$ may be alkyl, aryl, or alkoxy, $R_3$ may be hydrogen, alkyl, aryl, cycloalkyl or alkoxy and $R_4$ may be alkyl, aryl or alkoxy. Moreover, the reactions are shown to provide a route to polymerizable precursors where the silicon substituents are separated by a two-carbon bridge (Si—$CH_2$—$CH_2$—Si bonding unit). At the top of Scheme 1 are example starting materials within the first embodiment. These molecules are substituted derivatives of disilane. Shown at the top of Scheme 1 are highly substituted disilane derivatives, but related molecules with fewer alkoxy (OR) substituents may be used within the invention. Fluorine and chlorine substituents are also acceptable for the subsequent oxidative addition. The starting material may be symmetrical or unsymmetrical. A preferred substituent is alkoxy and most preferably multiple alkoxy substituents as shown at the top of Scheme 1 are used. The disilane bond is prone to oxidative cleavage and addition to Pi bonds in the presence of various metal catalysts (Pd, Pt, Rh, etc). Thus, within this invention, the units of the disilane are added across double bonds of olefins and allenes (shown in Scheme 1A), or across acetylenes (shown in Scheme 1B). This addition can be quite stereospecific (i.e., Z) in the case of addition to acetylenes. In the case of acetylenes and allenes, unsaturation is retained. An example using an acetylene derivative is shown in Scheme 1B. The unsaturation may be removed by hydrogenation if desired (vide infra) or it may be used intact to provide backbone crosslinking sites upon further processing. Depending on the nature and number of alkoxy substituents originally present, cyclic polymeric materials may also be produced upon sol gel condensation. In this regard, the hydrolysis of cyclic materials such as (33) leads to rapid cyclization, particularly in dilute solution.

Suitable solvents in which to perform the reactions shown in FIG. 1 include toluene, xylene, THF, glyme, diglyme and the like. The reactions shown in FIG. 1 are carried out at a temperature from about 75° C. to about 140° C., with a reaction temperature from about 90° C. to about 130° C.

being more preferred. Oxidative addition to olefins has been described using zero valent platinum (T. Hayashi et al Organometallics 1990, 9, 280). Low-valent palladium catalysts apparently do not work in oxidative addition to olefins. An alternative route to vicinal disilyl substituted alkanes is available through the platinum catalyzed hydrosilation of substituted vinyl silanes with various hydridosilane monomers (W. A. Piccoli et al J. Am. Chem. Soc. 1960, 82, 1883). Various low-valent palladium complexes are successful in promoting oxidative addition to acetylene and substituted acetylenes (H. Watanabe et al J. Organomet. Chem. 1981, 216, 149).

In these cases, one of the double bonds is retained and the stereochemistry is predominately Z. The olefins so obtained may be reduced using $H_2$ and Pd/C to produce the saturated derivative, if so desired (K. Rahumian et al Chem. Mater. 2005, 17, 1529).

The reactions of Scheme 1 provide a route to polymerizable precursors where the silicon substituents are separated by a two-carbon bridge, and these precursors are shown as item (31) and (33) in Scheme 1. Within the first embodiment, the precursors (31), (33), and related precursors are then used as shown in FIG. 2 to form the preliminary film. Within the first embodiment, as shown in FIG. 2, the preliminary film is then made into the final film using an energetic treatment step.

Within the second embodiment, the precursors (31) and (33) are converted to a cyclic precursor or a prepolymer prior to forming the preliminary film. Referring now to Scheme 2, precursor (31) wherein at least one of $R_1$ or $R_2$ is R*, preferably an alkoxy, further transformed by acid or base-catalyzed hydrolysis. Typically, the starting material is dissolved in methylene chloride and treated with 0.1N aqueous HCl solution at 25° C. for 24 hrs. The volatiles are removed and the residue redissolved in methylene chloride and dried over 4 Å molecular sieves. Higher dilutions favor the formation of cyclics when only two alkoxy substituents are present in the starting materials (K. Rahimian et al Chem. Mater. 2005, 17, 1529).

Scheme 2:

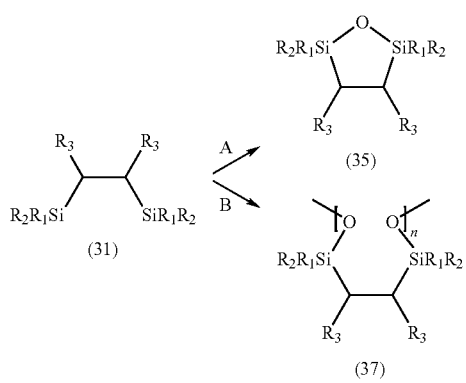

Depending on the stereochemistry of the oxidative addition, reaction with one equivalent of water can produce 2-oxa-1,3-disilylcyclopentanes containing additional functionality for subsequent condensation, as shown in Scheme 2, Path A, producing precursor (35). This reaction, along Path A, occurs when the silane substituents are either rigidly cis or are freely rotating. In cases where cyclization does not occur, hydrolysis leads to polymerization and crosslinking as shown in Scheme 2, Path B. This produces prepolymer (37). For monomers with multiple functionality (greater than two alkoxy groups), sol gel condensation occurs with addition of more water.

Within a second embodiment of the present invention, the precursor (35), or the prepolymer (37), are then used as shown in FIG. 2 to form the preliminary film. Within the second embodiment, as shown in FIG. 2, the preliminary film is then made into the final film using an energetic treatment step described above.

Referring now to Scheme 3, a third embodiment within the invention is shown in which a related synthetic procedure is applied to norbornene substituted monomers. This embodiment builds a Si—C copolymer that contains subunits related to a successful organic porogen molecule bicycloheptadiene (norbornadiene). First precursor (39) is selected, and the preliminary film contains the structure shown schematically as (41) formed by hydrolysis and condensation and is coated on the substrate. In step (42), controlled heating causes the loss of the polycyclic hydrocarbon fragments by retro Diels Alder reaction, forming a network organosilane containing bridging ethylene segments (43), a further stage of the preliminary film.

Scheme 3:

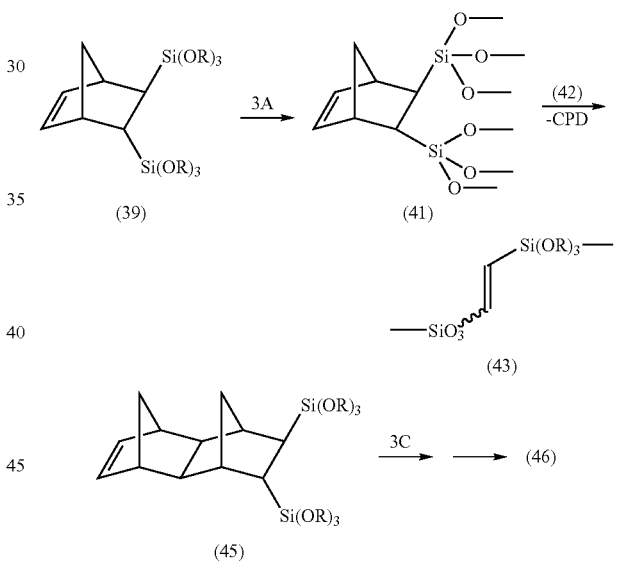

The steps of FIG. 2 which shows hydrolysis steps; in the above, the hydrolysis/condensation occurs in 3A, are applied. The double bonds in (43) are further incorporated into the final film and converted to single bonds during the energetic treatment step with UV curing being preferred.

An expanded list of candidate precursors is shown in Scheme 4, where the structures of precursors (47)-(52) are shown. Scheme 4 is related to scheme 3, but with a broader selection of cyclic structures. All of the structures except 51 are the result of Diels Alder cycloaddition of bis-trialkoxysilyethylene (see 33) with the respective 1,3-diene. Reference numeral 51 is the product of oxidative addition of the hexaalkoxy disilane to beta pinene. These routes are generally applicable and the structures in Scheme 4 are representative of a larger set.

Scheme 4:

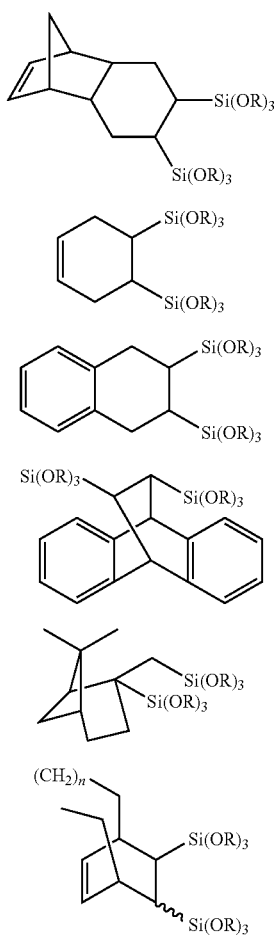

n = 1-3

In (47)-(52), the cyclic hydrocarbon is the functionality R*, the built-in sacrificial organic porogen group. This group is designed to be thermally labile or photoactive after sol gel processing forming the preliminary film.

Above, the applicants have described examples where this thermal lability has been introduced via retro Diels Alder chemistry or by the decomposition of strained rings. Within the invention, the thermal decomposition can be either by a single decomposition step or by stepwise thermal cascade. The end result is that a hydrocarbon moiety R* is removed during the energetic treatment Step 3 while retaining the two carbon bridge between the silicon functionality in the final film. Ideally in this case the alkoxy substituents are either wholly or partly composed of substituents which are thermally labile either directly or in the presence of thermally generated acid (i.e., tertiary alkoxy, benzyloxy, benzhydryl, cyclopropyl carbonyl, tert-butylcarboxy and the like).

According to the invention, in alternative embodiments, substituted diborane molecules containing B—B bonding are used in place of the disilane derivatives. The chemical schemes shown above in Schemes 1, 2, 3 and 4 are applicable to the substituted diborane molecules within the invention.

Scheme 5 shows a synthetic sequence to produce (by condensation) an alkoxylated, hyperbranched carbosilane (63). The alkoxy substituents here serve both as the source of condensation and crosslinking and as the source of porosity from the formation of sacrificial groups. The alkoxy groups in (63) are the R* group, within the fourth embodiment. The precursor shown in this scheme is then applied to a substrate and treated as described above in forming the final dielectric film.

Scheme 5:

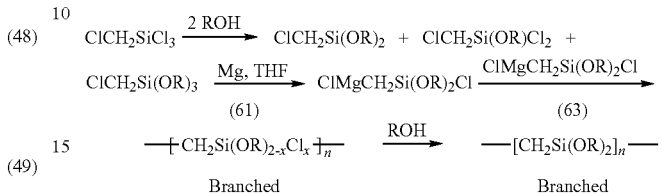

In addition to the above reactions, a thermal olefin generating reaction such as described in Schemes 6A-6G which can be used in the present application. In each of the reactions Schemes 6A-6G olefin reactions are performed which will cleave the side chains. This methodology represents an alternative to oxidative addition synthetic routes and the retro Diels-Alder routes mentioned above. Specifically, in these reactions pendant chains are eliminated by olefin forming reactions. In the olefin forming reactions the side chain becomes the pore generator. Schemes 7A-7B describe the concept employed.

Specifically, Scheme 7A discusses the route for monomers containing one functional silicon, while Scheme 7B describes the application to the preparation of carbosilane materials arising from monomers containing more than one silicon/monomer unit. The initial step in each figure is a sol-gel condensation to establish the polymer matrix. After the matrix is established, the final cure (thermal/photochemical) leads to complete curing of the organosilicate matrix material and the elimination of the labile substituents to produce porosity. The loss of the labile material is based on known elimination reactions to produce an olefin. For this reason a tether is utilized to provide: (i) a link to silicon for the labile substituent (ii) a scaffold for attaching the labile group to the molecule (iii) a structural unit for enabling the elimination. The result of this linkage is that an olefin unit remains attached to silicon in the matrix after the labile group is removed. This functionality can be further incorporated into the matrix through reaction. The linker in the manifestation described in Schemes 7A-7B should be at least two carbons in length and provide accessible hydrogens for elimination, which often proceeds via a cyclic transition state. The size of the group eliminated determines the size of the pore left behind and this can be tailored as desired. It is not necessary that the labile substituent be attached via a flexible linker as long as a viable elimination pathway exits.

Scheme 8, for example, shows olefin formation within a cyclic system where carbons bridge between two silicons. In Scheme 8, as shown previously in Schemes 7A-7B, the sol-gel matrix is established prior to elimination of the pore-generating group. The functionality left behind is still an olefin, albeit now one that is part of a cyclic system within the matrix. Clearly, n-alkyl or cyclic systems would not be required as long as hydrogens are accessible for elimination. It is well known that olefins are produced from the pyrolysis of esters, xanthates, amine oxides, quaternary ammonium salts, sulfones, sulfoxides and others. The structural requirements are the functional group and the presence of accessible hydrogens beta to the functionality (cyclic transition states).

In the case of esters and ketones, a similar fragmentation also occurs photochemically (Norrish II). This may well happen for the other derivatives as well if the irradiation source is of short wavelength where light is absorbed. Depending on the substitution pattern Norrish I fragmentation (alpha cleavage) can also be facilitated. These structural features can be incorporated into the labile R* group. For the thermal reactions, all that is required are beta hydrogens (i.e. a linker of at least two carbon atoms). The fragmentation reactions produce the pores whose size depends on that of the R* group.

Scheme 8 describes a postcuring porosity sequence derived from oxidative addition of substituted disilanes to vinyl esters. Hydrolysis of tetraalkoxy derivatives will lead to both intra and intermolecular condensation. Pyrolysis leads to beta elimination to produce unsaturation which can serve as an auxiliary matrix X-linking site. In principle, the same procedure could be applied to alpha-beta unsaturated esters, ketones, nitrites, etc. Again, photodecomposition is also a possibility.

Scheme 6A:

Preliminary Film

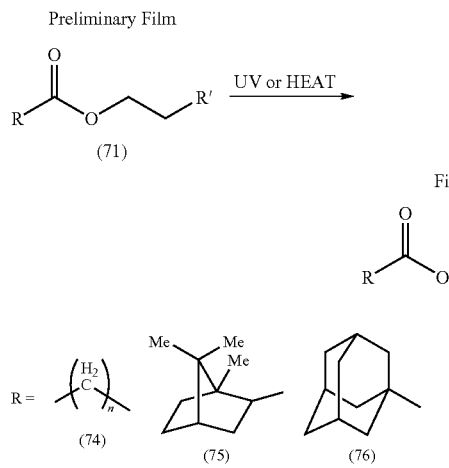

(71)

(73)

(74) (75) (76)

Scheme 6B:

Preliminary Film

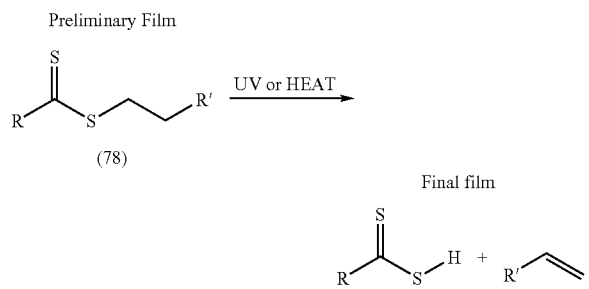

(78)

Scheme 6C:

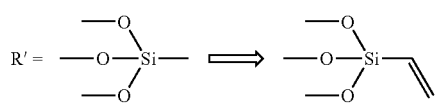

Scheme 6D:

Preliminary Film

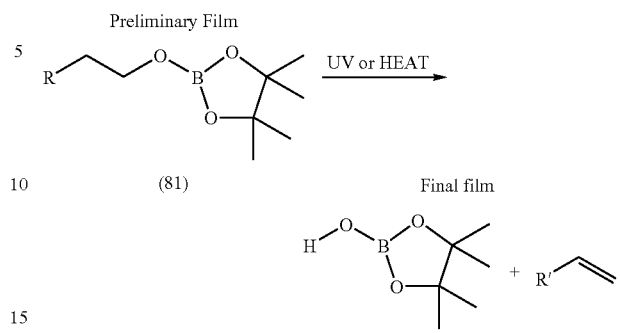

(81)

Final film

Scheme 6E:

Preliminary Film    Final film

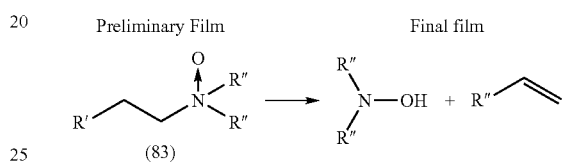

(83)

Scheme 6F:

Preliminary Film    Final film

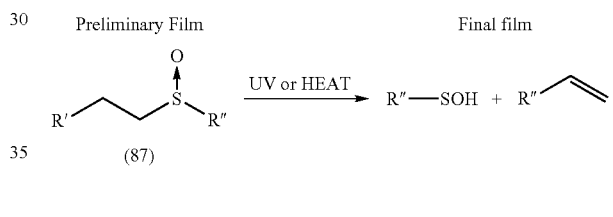

(87)

Scheme 6G:

Preliminary Film    Final film

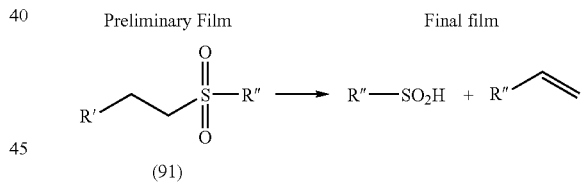

(91)

Scheme 7A:

Monosilane Precursors    Preliminary Film

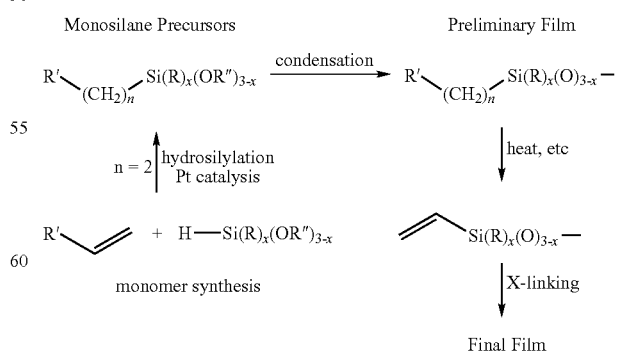

monomer synthesis

Final Film

R′ = acyl, ester, xanthate, amine oxide, borate, etc

Scheme 7B:

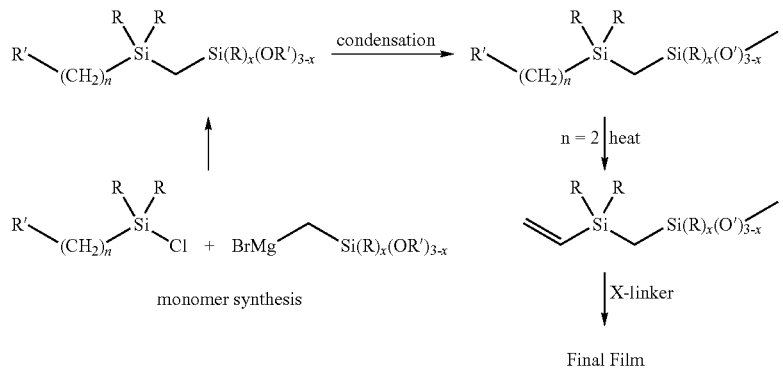

Scheme 8:

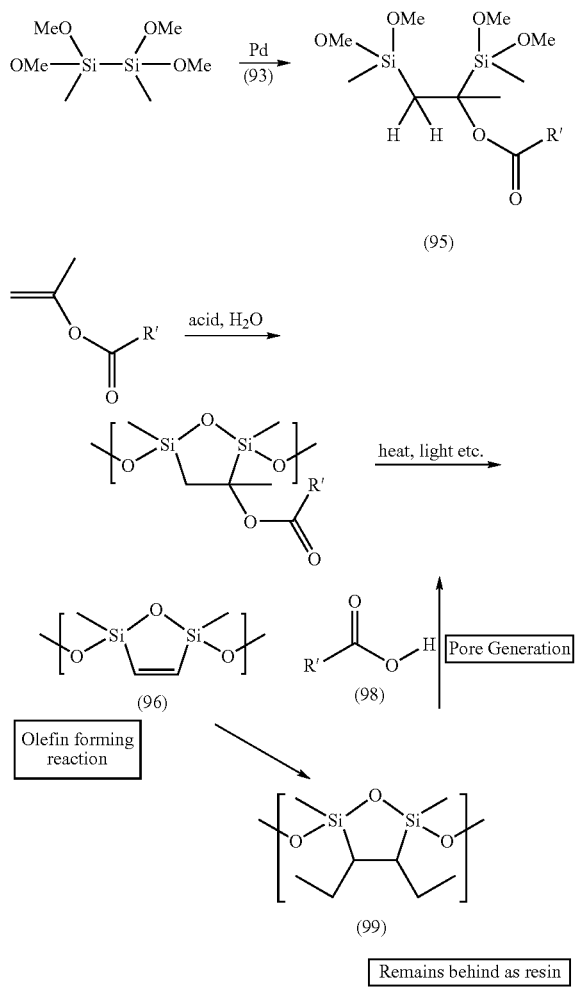

In another embodiment of the present invention, a PECVD process is used in forming the preliminary film. In the PECVD embodiment, any of the organosilicon precursors described above including the built-in organic porogen R can be used. Using PECVD, the hydrolytic sol-gel condensation in Schemes 7A-7B and Scheme 8 is replaced with a matrix forming plasma deposition process utilizing the alkoxy silane portion of the molecule in the same manner as is known in the art using commercial precursors such as diethoxymethylsilane (DEMS) and octamethyltetracyclosiloxane (OMCATS). Again, the porosity is predominately generated in a post deposition cure. Preferably, the PECVD process uses a disilapropane derivative and the processing conditions described in U.S. application Ser. No. 10/964,254, filed Oct. 13, 2004, the entire contents which are incorporated herein by reference, can be used in forming the preliminary film.

Within the present invention, an organosilicon precursor molecule that is preferably a disilapropane derivative is selected because the Si—$CH_2$—Si subunit in the precursor is then preserved in the final dielectric film, and this improves the film interactions with water and with plasma treatments occurring during integration.

Specifically, in this embodiment, the organosilicon precursor has the general molecular formula $R^*R^5R^6Si$—$(CH_2)_n$—$Si$—$R^7R^8R^9$, where n is 1-2, $R^*$ is a sacrificial porogen group and $R^{5-9}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents. According to the present invention, the sacrificial organic porogen group $R^*$ is selected from one of groups mentioned above for $R^*$.

The present invention yet further provides for optionally adding an oxidizing agent such as $O_2$, $N_2O$, $CO_2$ or a combination thereof to form a gas mixture including the organosilicon precursor, thereby stabilizing the precursor in the reactor and improving the properties and uniformity of the porous dielectric material being deposited. Optionally, a flow of a gas comprising one of CO, $N_2$, Ar, He, Ne, Xe or Kr may be added to improve the film.

The method of the present invention may further comprise the step of providing a parallel plate reactor, which has an area of a substrate chuck from about 85 $cm^2$ to about 750 $cm^2$, and a gap between the substrate and a top electrode from about 1 cm to about 12 cm. A high frequency RF power is applied to one of the electrodes at a frequency from about 0.45 MHz to about 200 MHz. Optionally, an additional RF power of lower frequency than the first RF power can be applied to one of the electrodes.

The conditions used for the deposition step may vary depending on the desired final dielectric constant of the porous dielectric material of the present invention. Broadly, the conditions used for providing a stable porous dielectric material comprising elements of Si, C, O, and H, and having a tensile stress of less than 60 MPa, an elastic modulus from about 2 to about 15 GPa, and a hardness from about 0.2 to about 2 GPa include: setting the substrate temperature within a range from about 100° C. to about 425° C.; setting the high frequency RF power density within a range from about 0.1 W/cm² to about 2.0 W/cm²; setting the organosilicon precursor flow rate within a range from about 10 mg/min to about 5000 mg/min; optionally setting the inert carrier gases, such as helium (or/and argon) flow rate within a range from about 10 sccm to about 5000 sccm; setting the reactor pressure within a range from about 1000 mTorr to about 10,000 mTorr; and setting the high frequency RF power within a range from about 50 W to about 1000 W. Optionally, a lower frequency power may be added to the plasma within a range from about 20 W to about 400 W. When the conductive area of the substrate chuck is changed by a factor of X, the RF power applied to the substrate chuck is also changed by a factor of X. When an oxidizing agent such as O2 is employed in the present invention, it is flowed into the reactor at a flow rate within a range from about 10 sccm to about 1000 sccm.

While liquid precursors are used in the above example, it is known in the art that the organosilicon gas phase precursors can also be used for the deposition.

In alternative embodiments, two or more organosilicon precursors are used, with one precursor providing Si—CH₂—Si bonding or Si—[CH₂]₂—Si bonding and the second precursor providing Si—O bonding. At least one of the two precursors contains a group R* which is as defined above. Methods according to the above embodiments are used, but with more than one precursor.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a SiCOH dielectric material comprising
    forming a preliminary dielectric film containing at least one organosilicon precursor with a built-in sacrificial organic porogen on a surface of a substrate from a vapor or liquid phase, said at least one organosilicon precursor containing the built-in sacrificial organic porogen is selected from silane (SiH₄) derivatives having the molecular formula SiR*R¹R²R³, disiloxane derivatives having the molecular formula R*R⁵R⁶Si—O—Si—R⁷R⁸R⁹, trisiloxane derivatives having the molecular formula R*R¹¹R¹²—Si—O—Si—R¹³R¹⁴—O—Si—R¹⁵R¹⁶R¹⁷ and disilaalkane derivatives having the molecular formula R*R⁵R⁶Si—(CH₂)ₙ—Si—R⁷R⁸R⁹, where n is 1-2, R* is a sacrificial porogen group and R¹⁻¹⁷, which may or may not be identical, are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents; and
    performing an energetic treatment step on said preliminary dielectric film to substantially remove said built-in sacrificial organic porogen from said preliminary dielectric film providing a porous dielectric film comprising atoms of Si, C, H and O that has a dielectric constant of about 2.7 or less and a uniform and narrow and uniform pore size distribution.

2. The method of claim 1 wherein the sacrificial porogen group R* is selected from a branched alkyl, branched alkoxy, cyclic alkyl, cyclic alkoxy, aldehydes, ketones, esters, thioesters, amines, urethanes, triphenyl, alkyl phenyl carbinyl, substituted allyl, cyclohepatrienyl, cyclopropyl carbonyl, nitriles, azo derivatives, and alkyl groups which are connected to Si by a linker group.

3. The method of claim 2 wherein said linker group is thermally/photochemically labile or provides a platform to which labile substituents can be attached.

4. The method of claim 3 wherein said linker group is hydroxyethyl, hydroxypropyl, aminoethyl, aminopropyl, carboxyethyl, carboxypropyl, or branched functional tethers.

5. The method of claim 1 wherein said at least one organosilicon precursor with the built-in sacrificial porogen is selected from the group consisting of molecules of the basic formula

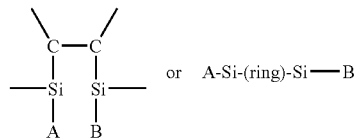

wherein at least one of A, B or ring is the sacrificial organic porogen R*, and ring is also either one hydrocarbon ring containing a C—C unit bonded between two Si atoms or a polycyclic structure containing a C—C unit between two Si atoms.

6. The method of claim 1 wherein said energetic treatment step includes UV light, ionizing radiation, thermal energy or a catalytic species.

7. The method of claim 1 wherein said preliminary film contains a functional group selected from the group consisting of branched or cyclic hydrocarbon groups, polycyclic hydrocarbon groups, branched or cyclic hydrocarbon groups bonded between two or more Si atoms, polycyclic hydrocarbon groups bonded between two or more Si atoms, acyl groups, ester groups, xanthate groups, amines, amine oxides, ethers, sulfonyl, sulfinyl, phosphate, phosphonyl, phosphinyl, organometallic and borate groups.

8. The method of claim 1 wherein said energetic treatment step releases molecules from the preliminary film that are selected from the group consisting of linear or cyclic hydrocarbon fragments, olefins, acetylenes, alcohols, organic acids, amides, vinyl esters, xanthates, thioacids, amines, hydroxylamines, phosphines, phosphoric acids, phosphoric esters, substituted phosphonic, phosphinic esters, sulfonic acids, sulfinic acids, sulfides, mercaptans, nitrites and borates, and fragments of the aforementioned functional groups.

9. The method of claim 1 wherein said preliminary dielectric film contains Si—CH₂—CH₂—Si bonding units.

10. The method of claim 1 wherein said forming said preliminary dielectric film comprises plasma enhanced chemical vapor deposition (PECVD) from a vapor or spin-on application from a liquid.

11. The method of claim 1 wherein said preliminary dielectric film includes Si—CH₂—Si bonding units.

12. The method of claim 1 wherein said pore size distribution has a maximum size pore of from about 0.1 to about 10 nanometers.

13. The method of claim 1 wherein said pore size distribution is within the cross-hatched area of FIG. 1.

14. A method of fabricating a SiCOH dielectric material comprising forming a preliminary dielectric film containing at least one organosilicon precursor with a built-in sacrificial organic porogen on a surface of a substrate from a vapor or liquid phase, said at least one organosilicon precursor containing the built-in sacrificial organic porogen comprises a molecule of either:

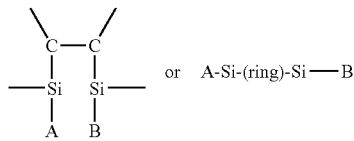

wherein at least one of A, B or ring is a sacrificial organic porogen R*, and ring is also either one hydrocarbon ring containing a C—C unit bonded between two Si atoms or a polycyclic structure containing a C—C unit between two Si atoms; and performing an energetically treatment step on said preliminary dielectric film to substantially remove said built-in sacrificial organic porogen from said preliminary dielectric film providing a porous dielectric film comprising atoms of Si, C, H and O that has a dielectric constant of about 2.7 or less and a uniform and narrow and uniform pore size distribution.

15. The method of claim 14 wherein said preliminary dielectric film contains Si—$CH_2$—$CH_2$—Si bonding units.

16. The method of claim 14 wherein said forming said preliminary dielectric film comprises plasma enhanced chemical vapor deposition (PECVD) from a vapor or spin-on application from a liquid.

17. The method of claim 14 wherein said pore size distribution has a maximum size pore of from about 0.1 to about 10 nanometers.

18. The method of claim 14 wherein said pore size distribution is within the cross-hatched area of FIG. 1.

19. The method of claim 14 wherein R* is selected from a branched alkyl, branched alkoxy, cyclic alkyl, cyclic alkoxy, aldehydes, ketones, esters, thioesters, amines, urethanes, triphenyl, alkyl phenyl carbinyl, substituted allyl, cyclohepatrienyl, cyclopropyl carbonyl, nitriles, azo derivatives, and alkyl groups which are connected to Si by a linker group.

20. The method of claim 19 wherein said linker group is thermally/photochemically labile or provides a platform to which labile substituents can be attached.

* * * * *